United States Patent
Chang et al.

(10) Patent No.: US 7,109,094 B2
(45) Date of Patent: Sep. 19, 2006

(54) METHOD FOR PREVENTING LEAKAGE IN SHALLOW TRENCH ISOLATION

(75) Inventors: Ming-Cheng Chang, Taoyuan (TW); Yi-Nan Chen, Taipei (TW); Jeng-Ping Lin, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 145 days.

(21) Appl. No.: 10/972,506

(22) Filed: Oct. 25, 2004

(65) Prior Publication Data

US 2005/0127469 A1 Jun. 16, 2005

Related U.S. Application Data

(62) Division of application No. 10/639,419, filed on Aug. 11, 2003, now Pat. No. 6,958,521.

(30) Foreign Application Priority Data

May 5, 2003 (TW) .............................. 92112210 A (51) Int. Cl.
*H01L 21/76* (2006.01)
(52) U.S. Cl. ..................... 438/434; 438/424; 438/430
(58) Field of Classification Search ................ 438/434
See application file for complete search history.

(56) References Cited

U.S. PATENT DOCUMENTS

| | | | | |
|---|---|---|---|---|
| 4,666,556 A | * | 5/1987 | Fulton et al. ............... 438/431 |
| 5,401,998 A | * | 3/1995 | Chiu et al. ................ 257/368 |
| 5,496,765 A | * | 3/1996 | Schwalke ................ 438/404 |
| 5,700,712 A | * | 12/1997 | Schwalke ................ 438/430 |
| 6,069,058 A | * | 5/2000 | Hong ..................... 438/436 |
| 6,096,598 A | | 8/2000 | Furukawa et al. |
| 6,200,881 B1 | * | 3/2001 | Lou ...................... 438/424 |

FOREIGN PATENT DOCUMENTS

| TW | 359001 | 5/1999 |
|---|---|---|
| TW | 395014 | 6/2000 |
| TW | 426935 | 3/2001 |

OTHER PUBLICATIONS

Hong Xiao, Introduction to semiconductor manufacturing technology, 2001, Prentice-Hall Inc., Upper Saddle River, New Jersey 07458.

* cited by examiner

*Primary Examiner*—Kenneth Parker
*Assistant Examiner*—José R. Diaz
(74) *Attorney, Agent, or Firm*—Quintero Law Office (57) ABSTRACT

Method for preventing sneakage in shallow trench isolation and STI structure thereof. A semiconductor substrate having a pad layer and a trench formed thereon is provided, followed by the formation of a doped first lining layer on the sidewall of the trench. A second lining layer is then formed on the doped first lining layer. Etching is then performed to remove parts of the first lining layer and the second lining layer so that the height of the first lining layer is lower than the second lining layer. A sacrificial layer is then formed on the pad layer and filling the trench. Diffusion is then carried out so that the doped ions in the first lining layer out-diffuse to the substrate and form diffuse regions outside the two bottom corners of the trench.

18 Claims, 10 Drawing Sheets

METHOD FOR PREVENTING LEAKAGE IN SHALLOW TRENCH ISOLATION

This application is a divisional of U.S. application Ser. No. 10/639,419, filed Aug. 11, 2003, U.S. Pat. No. 6,958,521

BACKGROUND OF THE INVENTION

1. Field of the Invention

The present invention relates to a semiconductor process and in particular to a method for preventing sneakage in shallow trench isolation (STI) and structure thereof.

2. Description of the Related Art

The trend in developing semiconductor devices with smaller size and higher integration density has resulted in reduced distance between transistors. Shallow trench isolation (STI) is currently the most widely applied method isolating transistors. It has replaced the conventional method of local oxidation of silicon (LOCOS) to satisfy the requirements for generations less than 0.18 microns.

Figure 1:
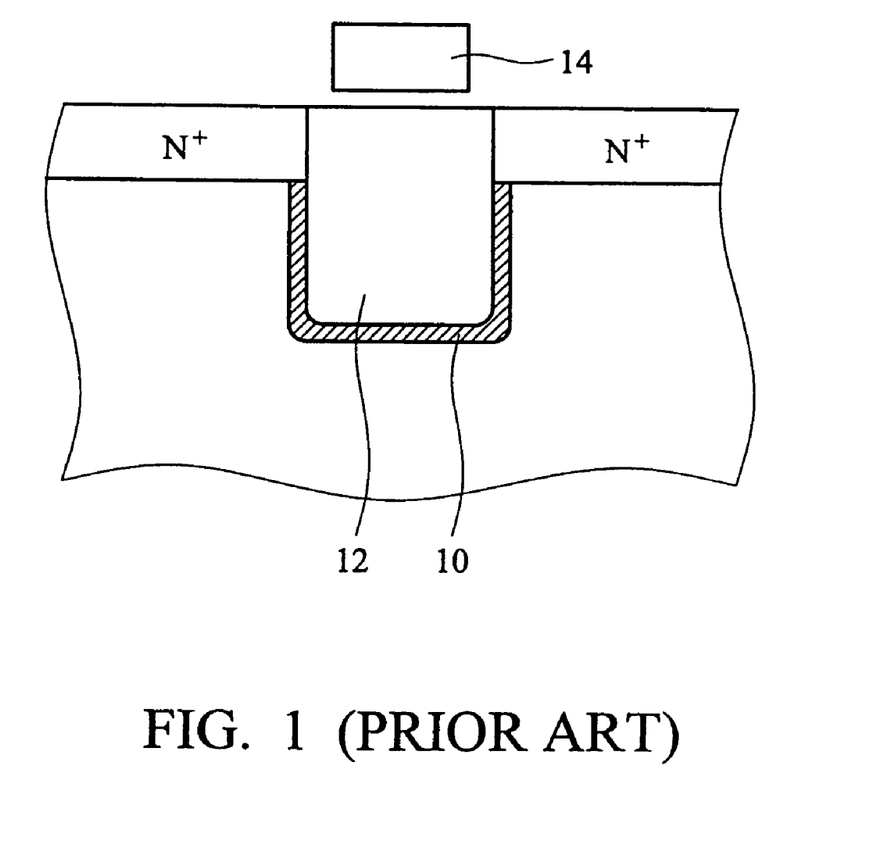
FIG. 1 is cross section of a conventional STI structure.

FIG. 1 is a cross section of a conventional STI structure, 14 represents a gate, 12 is an STI area, and n+ represents doped regions at two sides of the STI 12. Turning on a passing wordline (not shown) causes leakage of electric charge stored in the memory cell, a condition known as sneakage which is shown as 10 in the figure. This adversely affects performance of semiconductor elements. One current method of solving the above problem is forming STIs with deeper trenches. As trench depth shrinks, however, filling the trenches becomes more difficult.

Figure 2A:
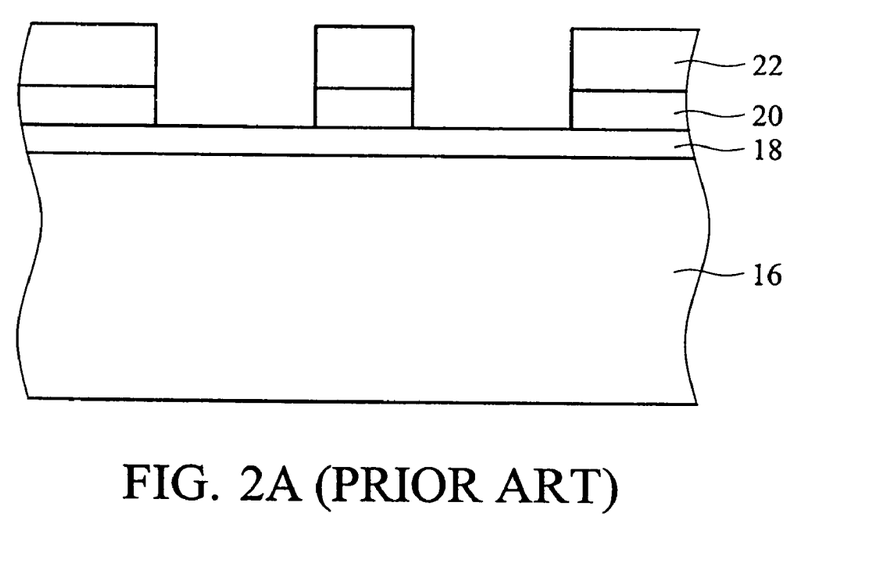
FIG. 2A~2C are cross sections showing the process of implanting sidewall of a STI structure.
Figure 2B:
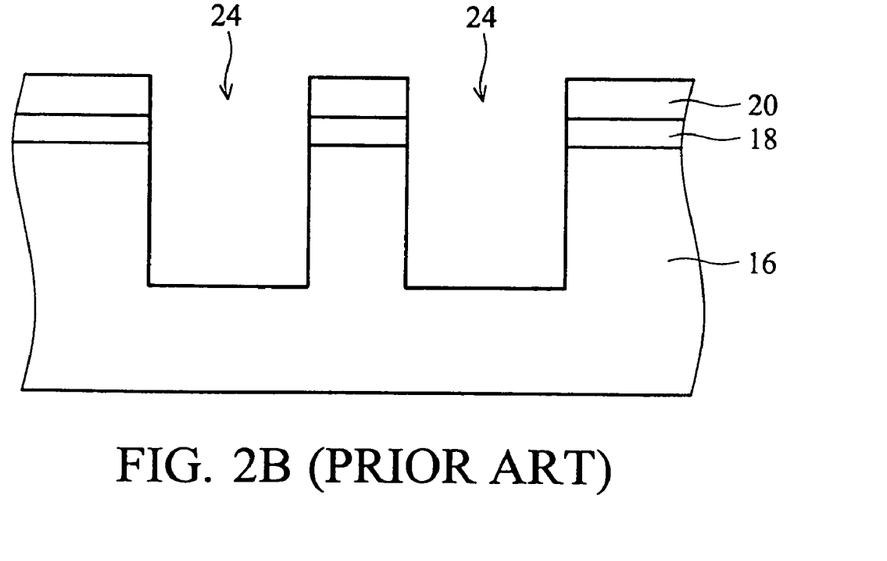
Figure 2C:
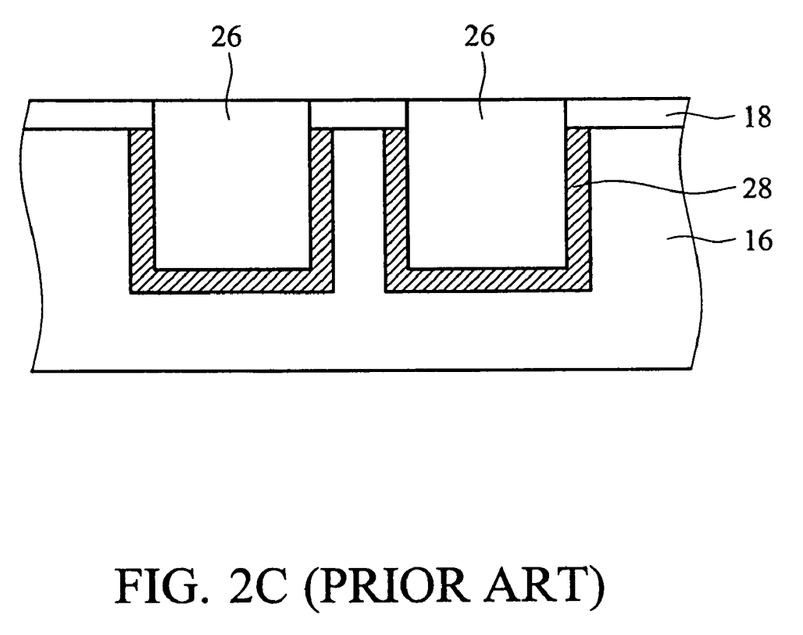

Another method is implanting the sidewall of a trench to avoid formation of leaking passages therein. FIGS. 2A~2C illustrate cross sections of the above-mentioned method. A semiconductor 16 having a nitride layer 20 and an oxide layer 18 formed thereon is provided, as shown in FIG. 2A. A photoresist layer 22 is used to define an isolation region, followed by etching to form a trench 24, shown in FIG. 2B. The sidewall of the trench is then implanted to form the implantation region 28, shown in FIG. 2C. Formation of a leaking passage on the sidewall is thus prevented. Finally, silicon oxide 26 is filled in the trench to form a shallow trench isolation structure.

The shortcoming of the above-mentioned method is damage caused to the semiconductor substrate during implantation. Hence, there is a need for a better method of avoiding sneakage in shallow trench isolation structures.

SUMMARY OF THE INVENTION

Accordingly, an object of the invention is to provide a method that prevents sneakage in shallow isolation trench structures.

The method for preventing sneakage in shallow trench isolation comprises the steps of: providing a semiconductor substrate having a pad stack layer and a trench formed therein; forming a doped first lining layer conformally on the sidewall of the trench; forming a second lining layer conformally on the doped first lining layer; etching the first lining layer and the second lining layer so that the height of the first lining layer is lower than the second lining layer; forming a sacrificial layer on the pad layer and filling the trench; subjecting the first lining layer to diffusion so that the doped ions in the first lining layer out-diffuse to the substrate and form diffuse regions at two bottom corners of the trench.

According to another embodiment of the invention, the method includes the steps of: providing a semiconductor substrate having a pad stack layer and a trench formed therein; forming a doped first lining layer conformally on the sidewall and the bottom of the trench; forming a second lining layer covering the doped first lining layer on the sidewall of the trench; etching the first lining layer and the second lining layer so that the height of the first lining layer is lower than the second lining layer; forming a sacrificial layer on the pad layer and filling the trench; subjecting the first lining layer to diffusion so that the doped ions in the first lining layer out-diffuse to the substrate and form a diffuse region outside the bottom of the trench partially extending to the sidewall of the trench.

According to the method provided in the invention, an STI structure without sneakage comprises: a semiconductor substrate; a trench filled with dielectric material, formed in the semiconductor substrate; and a diffuse region, formed in the semiconductor substrate around the two bottom corners of the trench.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

FIGS. 3A~3H are cross sections showing the method for preventing sneakage in shallow trench isolation according to the First Embodiment of the invention.

Figure 3A:
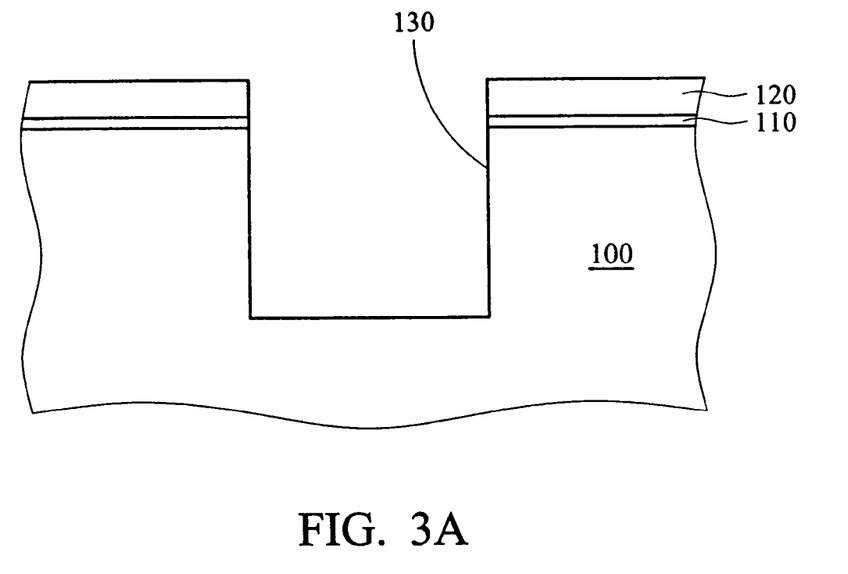
FIG. 3A~3H are cross sections showing the process according to the first embodiment of the invention.
Figure 3B:
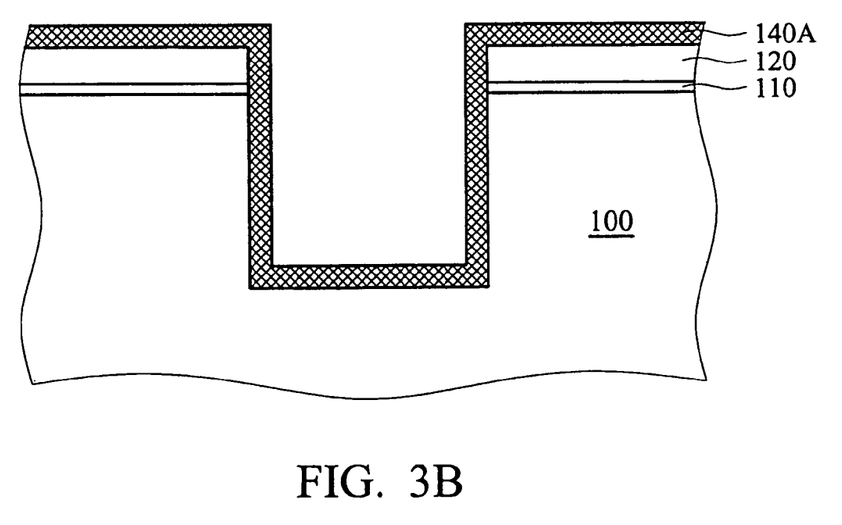
Figure 3C:
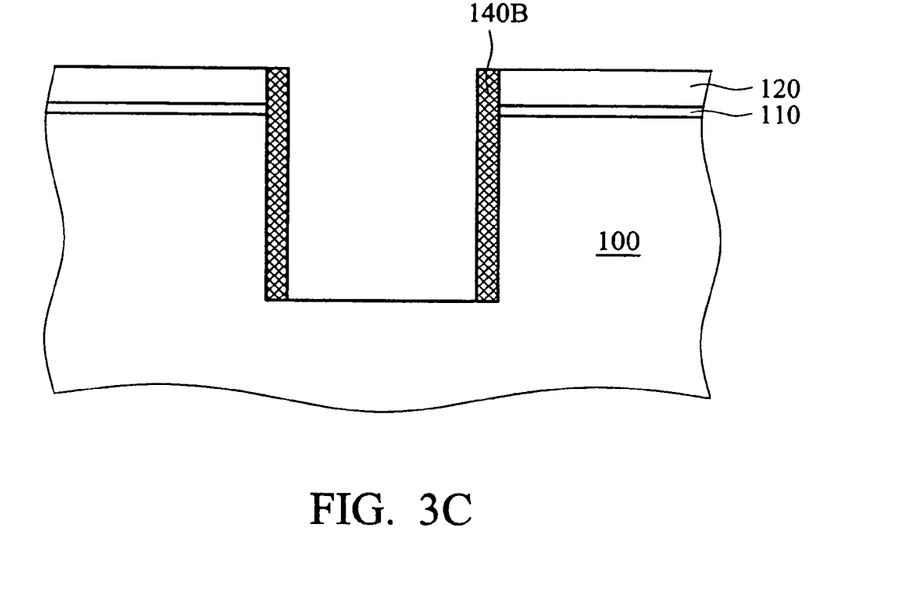

As shown in FIG. 3A, a semiconductor 100 having a trench 130 and a pad stack layer (including a nitride layer 120 and an oxide layer 110) formed therein is provided. Next, as shown in FIG. 3B, a doped first lining layer 140A is formed conformally to cover the nitride layer 120, the sidewall and bottom of the trench 130. Anisotropic etching, such as reactive ion etching (RIE) is then performed to remove the first lining layer 140A on the nitride layer 120 and the bottom of the trench 130 to form a first lining layer 140B, as shown in FIG. 3C. The doped first lining layer is preferably boron silicon glass (BSG).

Figure 3D:
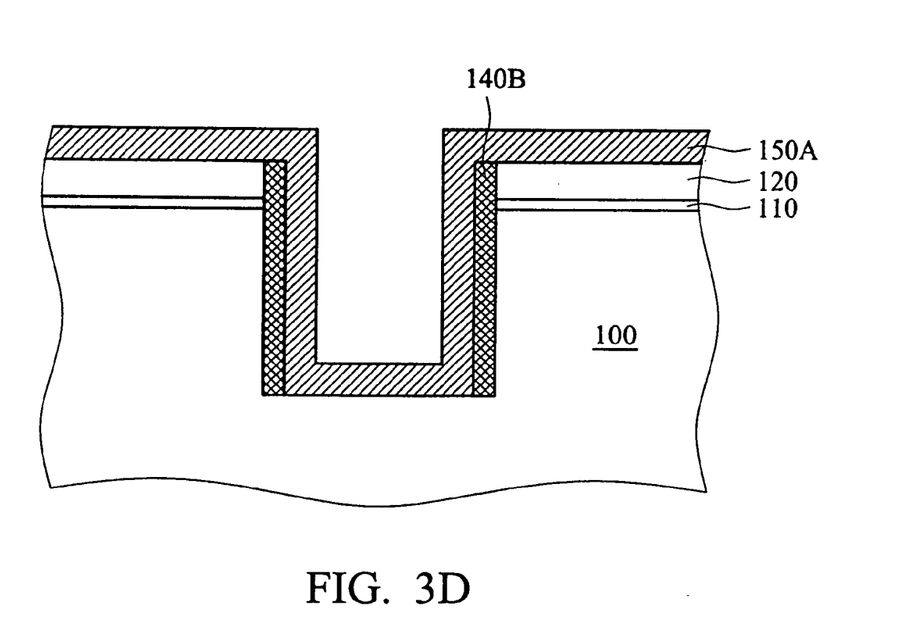
Figure 3E:
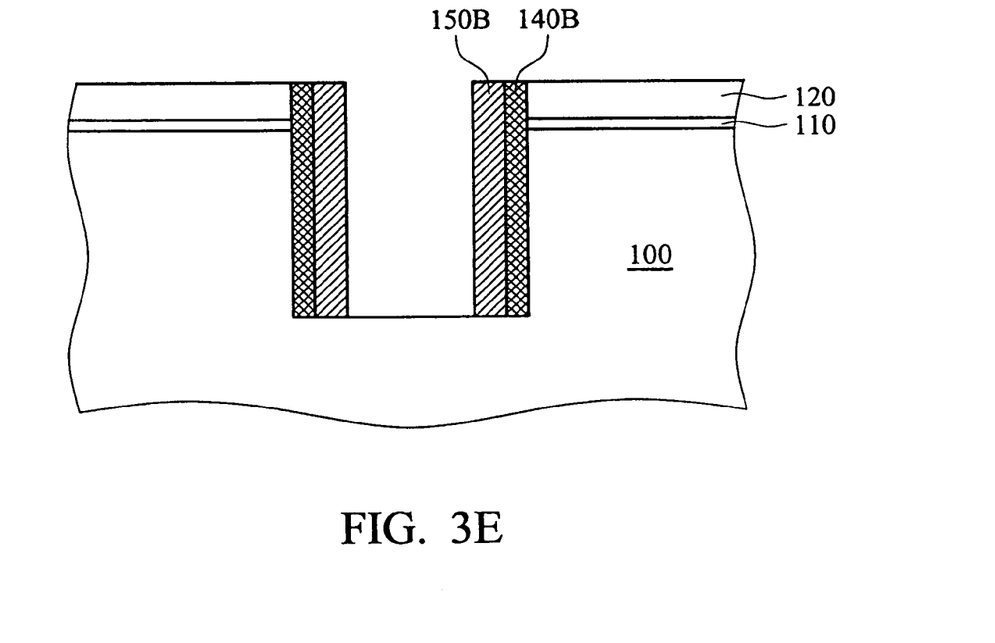

Then, as shown in FIG. 3D, a second lining layer 150A is formed conformally to cover the nitride layer 120, the sidewall and bottom of the trench, followed by anisotropic etching, such as RIE or plasma etching to remove the second lining layer on the nitride layer 120 and the bottom of the trench. A second lining layer 150B is thus formed. The second lining layer is preferably non-doped silicon glass (NSG).

Figure 3F:
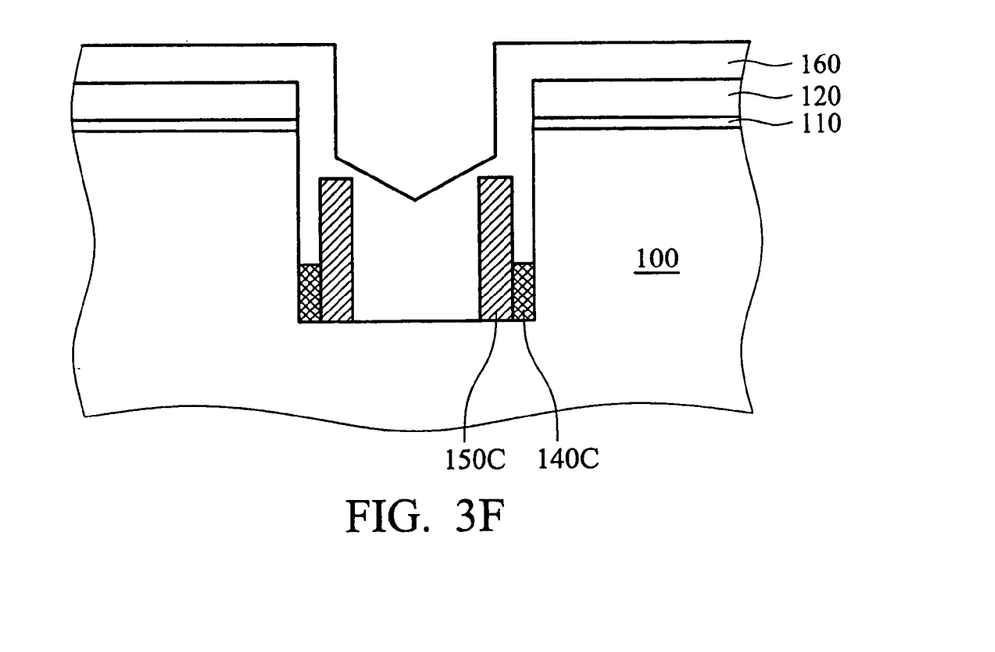

Next, etching is carried out to remove portions of the first lining layer 140B and the second lining layer 150B to form the second lining layer 150C and the first lining layer 140C as shown in FIG. 3F. The height of the second lining layer 150 is greater than that of the first lining layer 140C, i.e. the first lining layer only remains at the bottom corners of the trench. In this step, etching is carried out by using etching solutions where the etching rate of the BSG is greater than that of the NSG. Therefore, the first lining layer 140C is lower than the second lining layer 150C.

preferably the etching solution for this invention is buffered hydrogen fluoride (BHF), wherein the ratio of $NH_4F$: $HF$:$H_2O$ is preferably 5:1:48. Etching rates for NSG and BSG are 1200 angstroms/min and 7000 angstroms/min respectively. Another preferable etching solution is ammonium hydrogen peroxide mixture (APM) at 65° C., wherein the ratio of $NH_4OH$:$H_2O_2$:$H_2O$ is preferably 1:1:5. Etching rates for NSG and BSG are 5 angstroms/min and 200 angstroms/min respectively.

Figure 3G:
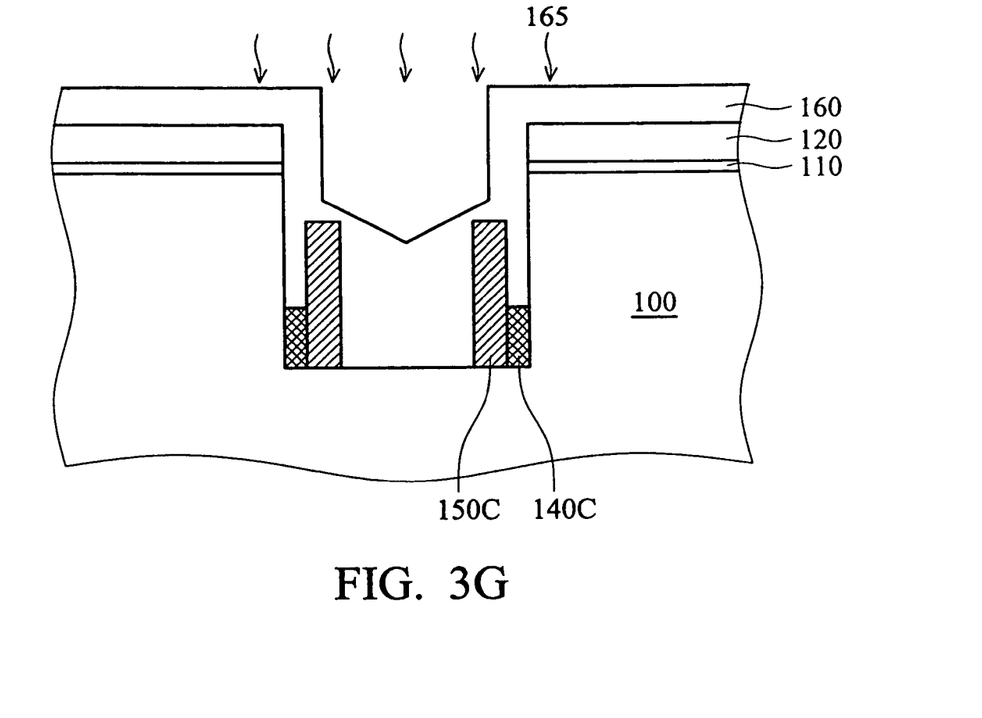
Figure 3H:
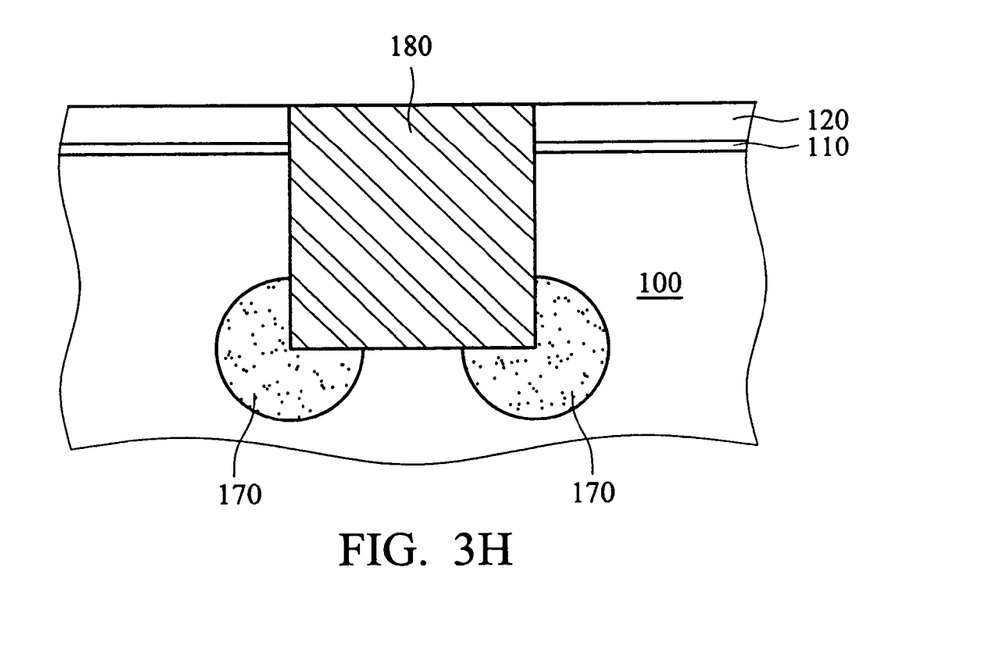

Next, as shown in FIG. 3F, a sacrificial layer 160, preferably non-doped glass (NSG) is formed to fill the trench and cover the nitride layer 120. The sacrificial layer is preferably formed by plasma enhanced chemical vapor deposition (PECVD). Then, as shown in FIG. 3G, Boron ions doped in the first lining layer 140C out-diffuse to the substrate, as denoted by 165, to form a diffuse region 170, as shown in FIG. 3H. Out-diffusion of the boron ions is preferably carried out by a thermal annealing treatment. Preferable annealing temperature and time are 900~1000° C., and 15~40 sec respectively.

Then, isotropic etching (using AMP at 60° C.) is used to remove the sacrificial layer 160, the first lining layer 140C and the second lining layer 150C. The conventional method is then performed to form a dielectric layer 180 of silicon oxide, which fills the trench, by a method such as high density plasma. Chemical mechanical polishing (CMP) is then carried out to polish the surface of the dielectric layer to obtain a shallow trench isolation structure as illustrated in the figure.

The shallow trench isolation structure obtained, comprises a semiconductor 100, a trench filled with dielectric material 160, and diffuse regions 170 around the bottom corners of the trench, shown in FIG. 3H. Since the diffuse regions 170 containing opposite charges with respect to the N+ regions on two sides of the trench, are formed outside the bottom corners of the trench in the semiconductor substrate, sneakage in STI is eliminated as leaking passages around the trench have been prevented.

Second Embodiment

FIGS. 4A~4H are cross sections showing the process according to the Second Embodiment of the invention.

Figure 4A:
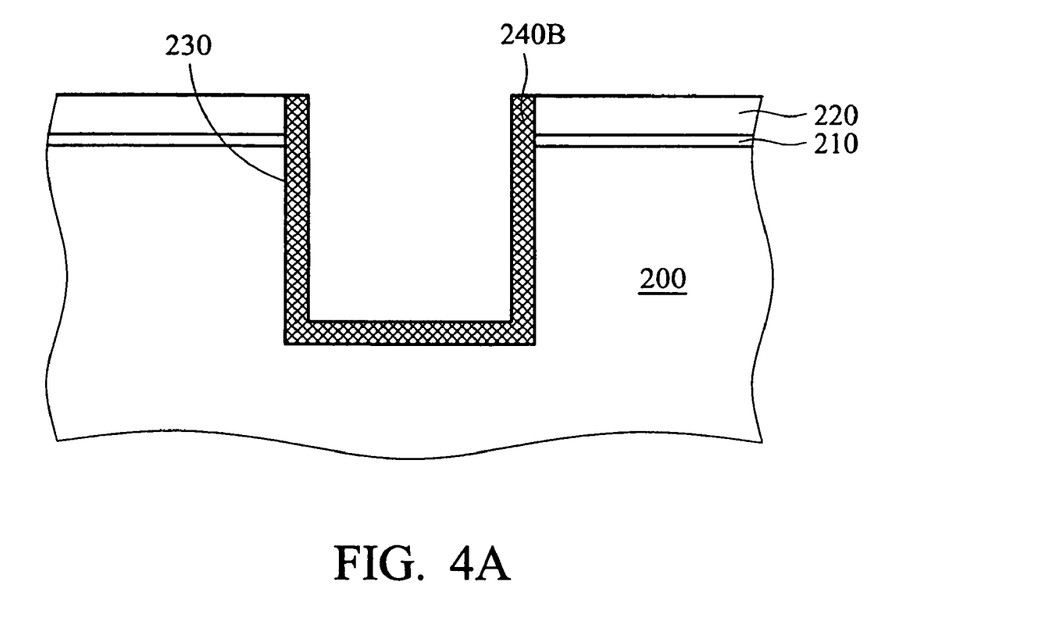
FIG. 4A~4F are cross sections showing the process according to the second embodiment of the invention.
Figure 4B:
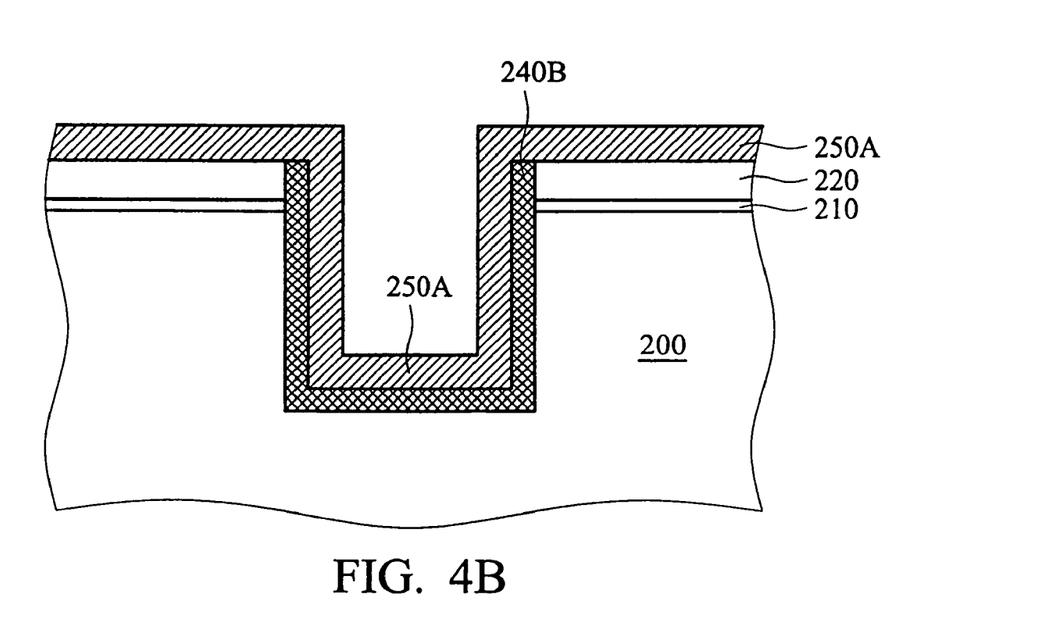

As shown in FIG. 4A, a semiconductor 200 having a trench 230 and a pad stack layer (includes a nitride layer 220 and an oxide layer 210) formed thereon is provided. Next, as shown in FIG. 4B, a doped first lining layer 240A is formed conformally to cover the nitride layer 220 and the sidewall and the bottom of the trench 230. Isotropic etching, using solution such as APM at 60° C. is then performed to remove the first lining layer 240A on the nitride layer 220 and the bottom of the trench 230 to form a first lining layer 240B. The doped first lining layer is preferably boron silicon glass (BSG).

Figure 4C:
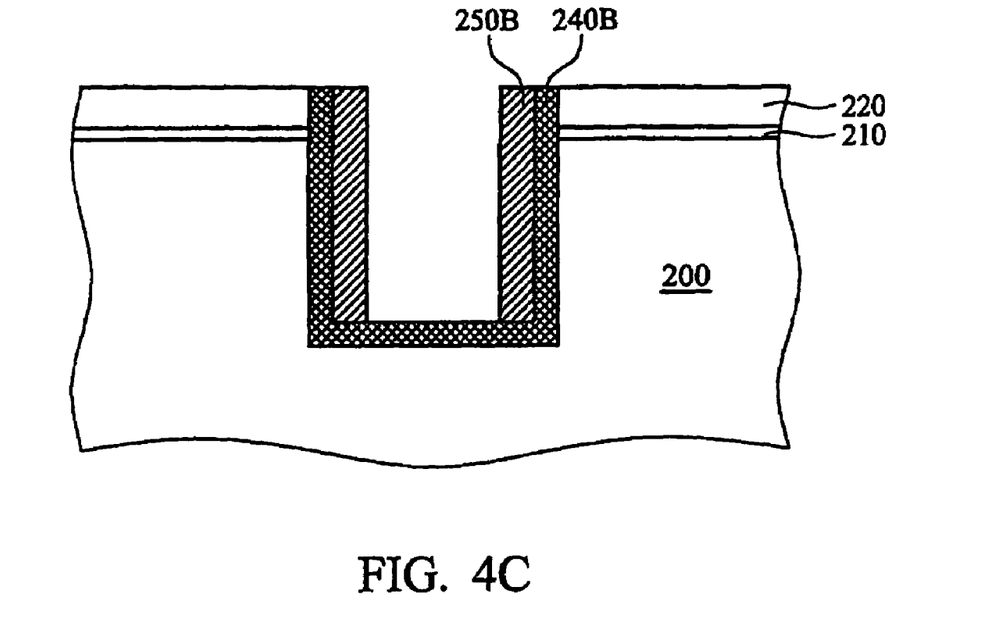

Then, as shown in FIG. 4B, a second lining layer 250A is formed conformally to cover the nitride layer 220 and the sidewall and the bottom of the trench, followed by removing the second lining layer on the nitride layer 220 and at the bottom of the trench. A second lining layer 250B, as shown in FIG. 4C, is thus formed. The second lining layer is preferably non-doped silicon glass (NSG).

Figure 4D:
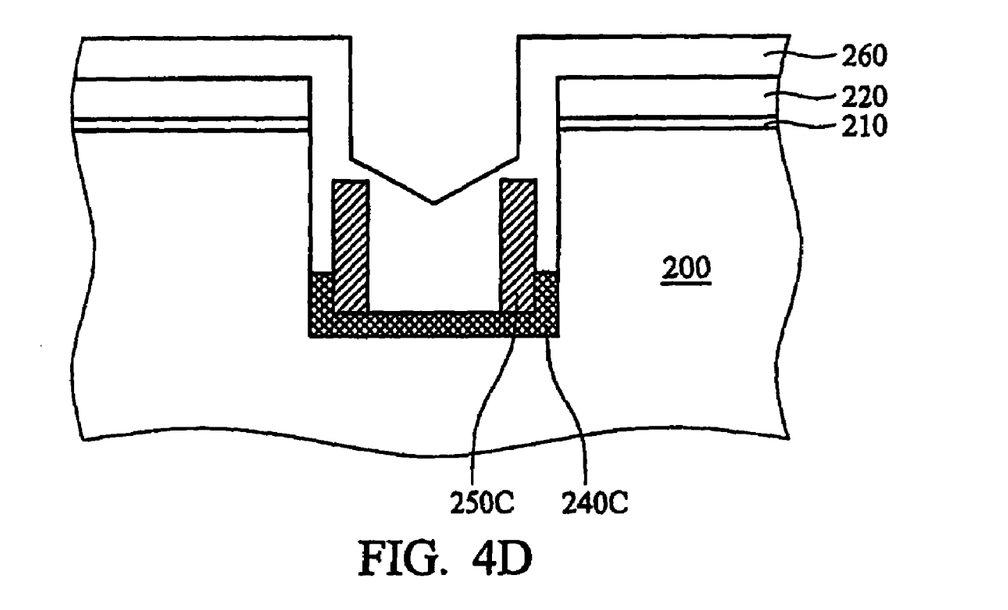

Next, etching is carried out to remove portions of the first lining layer 240B and the second lining layer 250B to form the second lining layer 250C and the first lining layer 240C as shown in FIG. 4D. The height of the second lining layer 250 is greater than that of the first lining layer 240C, i.e. the first lining layer remains at the bottom and corners of the trench. In this step, etching is carried out by using etching solutions with a faster etching rate for BSG than NSG. Therefore, the first lining layer 240C is lower than the second lining layer 250C.

The preferable etching solution for this invention is buffered hydrogen fluoride (BHF), wherein the ratio of $NH_4F$:$HF$:$H_2O$ is preferably 5:1:48. Etching rates for NSG and BSG are 1200 angstroms/min and 7000 angstroms/min respectively. Another preferably etching solution is ammonium hydrogen peroxide mixture (APM) at 65° C., wherein the ratio of $NH_4OH$:$H_2O_2$:$H_2O$ is preferably 1:1:5. Etching rates for NSG and BSG are 5 angstroms/min and 200 angstroms/min respectively.

Figure 4E:
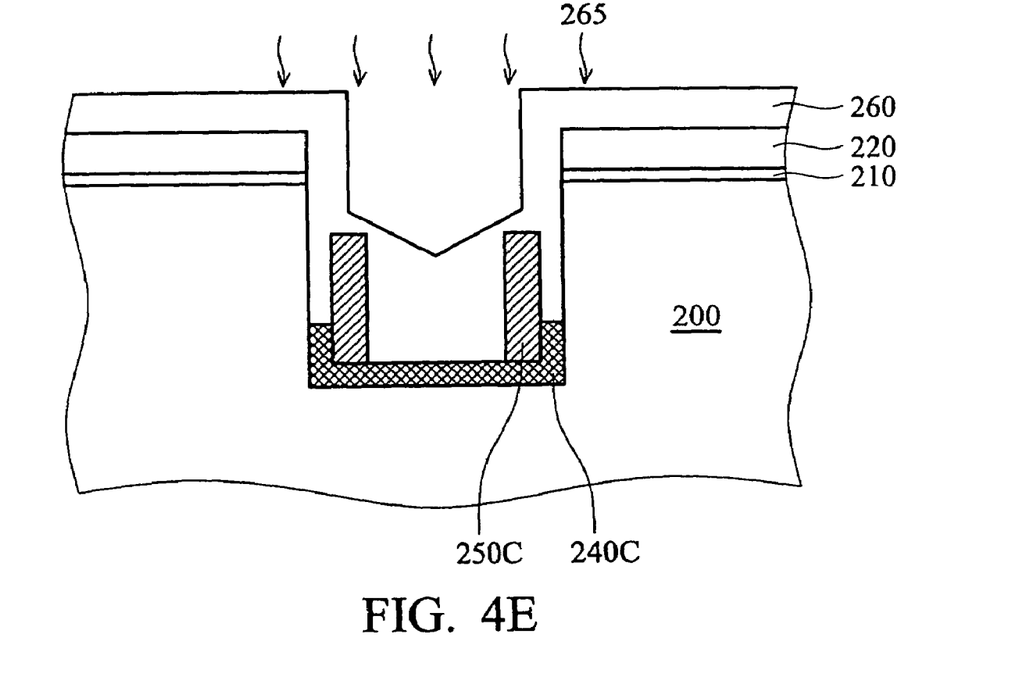
Figure 4F:
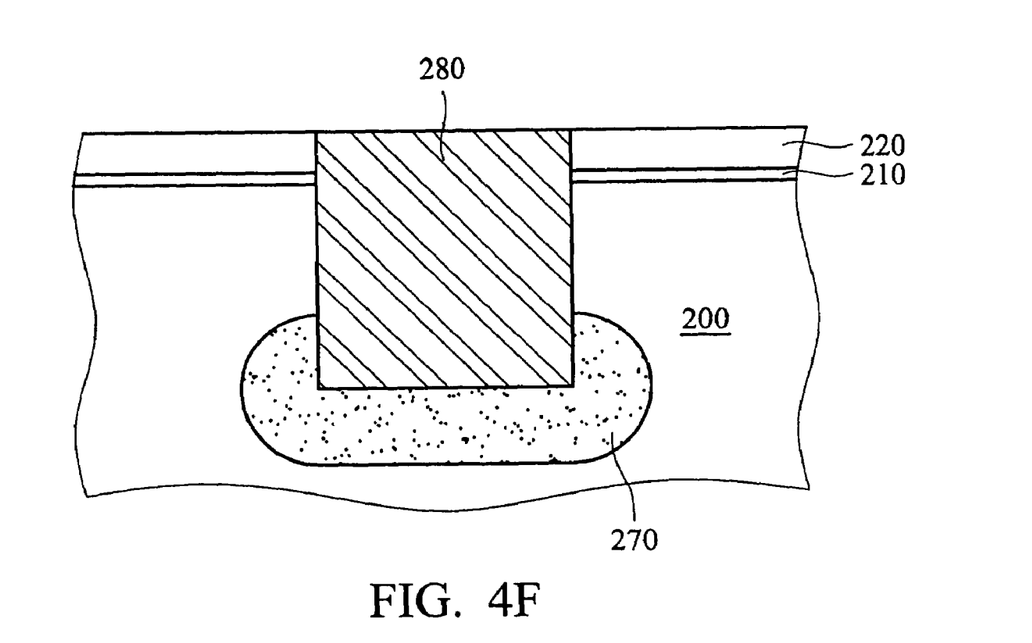

Next, as shown in FIG. 4D, a sacrificial layer 260, preferably non-doped glass (NSG) is formed to fill the trench and to cover the nitride layer 220. The sacrificial layer 260 is preferably formed by plasma enhanced chemical vapor deposition (PECVD). Then, as shown in FIG. 4E, Boron ions in the first lining layer 240C out-diffuse to the substrate, as denoted by 265, to form a diffuse region 270, as shown in FIG. 4F. Out-diffusion of the boron ions is preferably carried out by a thermal annealing treatment. Preferably the annealing treatment is carried out for 30 sec~5 min at a temperature of 800~1000° C.

Then, isotropic etching (using AMP at 60° C.) is carried out to remove the sacrificial layer 260, the first lining layer 240C, and the second lining layer 250C. The conventional method is then performed to form a dielectric layer 280 of silicon oxide, which fills the trench, by a method such as high density plasma. Chemical mechanical polishing (CMP) is then carried out to polish the surface of the dielectric layer to obtain a shallow trench isolation structure as illustrated in the figure.

The shallow trench isolation structure obtained, comprising a semiconductor 200, a trench filled with is dielectric material 260, and diffuse regions 270 around the bottom corners of the trench, is shown in FIG. 4F. Since the diffuse region 270, containing opposite charges with respect to the N+ regions on two sides of the trench, are formed outside the bottom corners of the trench in the semiconductor, sneakage at STI is effectively inhibited.

According to the method for preventing sneakage in shallow trench isolation, an ion doped region is formed either outside the bottom corners of the trench or extending along the bottom in the semiconductor substrate. By doing so, the capacitive STI transistors are more difficult to turn on, thereby avoiding sneakage current in the STI structure. Performance of semiconductor elements is thus improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A method for preventing leakage in shallow trench isolation, comprising:

providing a semiconductor substrate having pad stack layer and a trench formed thereon;

forming a doped first lining layer conformally on the sidewall of the trench;

forming a second lining layer conformally on the doped first lining layer;

etching the first lining layer and the second lining layer so that the height of the first lining layer is lower than the second lining layer;

forming a sacrificial layer on the pad layer and filling the trench; and subjecting the first lining layer to a heat treatment so that the doped ions in the first lining layer out-diffuse to the substrate and form diffusion regions around the two bottom corners of the trench.

2. The method as claimed in claim 1, further comprising removing the sacrificial layer, the first lining layer and the second lining layer.

3. The method as claimed in claim 1, wherein the pad stack layer comprises a nitride layer and an oxide layer.

4. The method as claimed in claim 1, wherein the first lining layer is boron silicon glass (BSG).

5. The method as claimed in claim 1, wherein the second lining layer is non-doped silicon glass (NSG).

6. The method as claimed in claim 1, wherein the sacrificial layer is non-doped silicon glass (NSG).

7. The method as claimed in claim 1, wherein the etching step is carried out by buffered hydrogen fluoride (BHF) or ammonium peroxide mixture (APM).

8. A method as claimed claim 1, wherein the heat treatment is carried out by annealing.

9. The method as claimed in claim 8, wherein the annealing temperature is 900~1000° C. and annealing time is 15~40 sec.

10. A method for preventing leakage in shallow trench isolation, comprising:

providing a semiconductor substrate having a pad stack layer and a trench formed thereon;

forming a doped first lining layer conformally on the sidewall and the bottom of trench;

forming a second lining layer to cover the doped first lining layer on the sidewall of the trench;

etching the first lining layer and the second lining layer so that the height of the first lining layer is lower than the second lining layer;

forming a sacrificial layer on the pad layer and filling the trench; and subjecting the first lining layer to a heat treatment so that the doped ions in the first lining layer out-diffuse to the substrate and form a diffusion region around the bottom of the trench.

11. The method as claimed in claim 10, further comprising removing the sacrificial layer, the first lining layer and the second lining layer.

12. The method as claimed in claim 10, wherein the pad stack layer comprises a nitride layer and an oxide layer.

13. The method as claimed in claim 10, wherein the first lining layer is boron silicon glass (BSG).

14. The method as claimed in claim 10, wherein the second lining layer is non-doped silicon glass (NSG).

15. The method as claimed in claim 10, wherein the sacrificial layer is non-doped silicon glass (NSG).

16. The method as claimed in claim 10, wherein the etching step use buffered hydrogen fluoride (BHF) or ammonia peroxide mixture (APM).

17. The method as claimed claim 10, wherein the heat treatment is performed by annealing.

18. The method as claimed in claim 10, wherein the annealing temperature is 900~1000° C. and annealing time is 15~40 sec.

* * * * *